(12) United States Patent
Ma et al.

(10) Patent No.: US 9,864,270 B2
(45) Date of Patent: Jan. 9, 2018

(54) PELLICLE AND METHOD FOR MANUFACTURING THE SAME

(71) Applicant: TAIWAN SEMICONDUCTOR MANUFACTURING COMPANY LTD., Hsinchu (TW)

(72) Inventors: Jeng-Shin Ma, Taipei (TW); Tsiao-Chen Wu, Hsinchu County (TW); Chi-Ming Yang, Hsinchu (TW); Chyi Shyuan Chern, Taipei (TW); Chih-Cheng Lin, Kaohsiung (TW); Yun-Yue Lin, Hsinshu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 78 days.

(21) Appl. No.: 14/996,966

(22) Filed: Jan. 15, 2016

(65) Prior Publication Data
US 2017/0205705 A1 Jul. 20, 2017

(51) Int. Cl.
*G03F 1/62* (2012.01)
*G03F 1/64* (2012.01)

(52) U.S. Cl.
CPC . *G03F 1/64* (2013.01); *G03F 1/62* (2013.01)

(58) Field of Classification Search
CPC .................................... G03F 1/62; G03F 1/64
USPC .............................................................. 430/5
See application file for complete search history.

(56) References Cited

U.S. PATENT DOCUMENTS

| | | | |
|---|---|---|---|
| 2013/0250260 A1* | 9/2013 | Singh | G03F 1/62 355/53 |
| 2016/0313637 A1* | 10/2016 | Jansen | G03F 1/24 |
| 2017/0090278 A1* | 3/2017 | Chiu | G03F 1/62 |

* cited by examiner

*Primary Examiner* — John A McPherson
(74) *Attorney, Agent, or Firm* — WPAT, P.C., Intellectual Property Attorneys; Anthony King

(57) ABSTRACT

A method for manufacturing a pellicle includes: providing a supporting substrate; forming an oxide layer over the supporting substrate; forming a metal layer over the oxide layer; forming a graphene layer over the metal layer; and removing at least a portion of the supporting substrate and the oxide layer. An associated method includes: providing a supporting substrate; forming a first silicon carbide (SiC) layer or a diamond layer over the supporting substrate; forming a graphene layer over the SiC layer or the diamond layer; and removing at least a portion of the supporting substrate and the first silicon carbide (SiC) layer or the diamond layer; wherein the pellicle is at least partially transparent to extreme ultraviolet (EUV) radiation. An associated pellicle is also disclosed.

20 Claims, 13 Drawing Sheets

PELLICLE AND METHOD FOR MANUFACTURING THE SAME

BACKGROUND

The small size of features patterned using extreme ultraviolet (EUV) light radiation means that any particulate contamination within a lithographic apparatus can have significant detrimental effects on a manufactured integrated circuit. For example, if a particle was present on a patterning device during patterning it may cause an image of the particle to be formed on a substrate. It is known to use a pellicle film to protect a patterning device from particle contamination, so as to prevent any degradation in the performance of the lithographic apparatus in the presence of some particles. However, to form a pellicle film which is sufficiently transparent to EUV radiation so as to not reduce the performance of the lithographic apparatus each pellicle film must be made of an extremely thin film. The extremely thin film also requires having high degree of chemical stability with respect to EUV light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
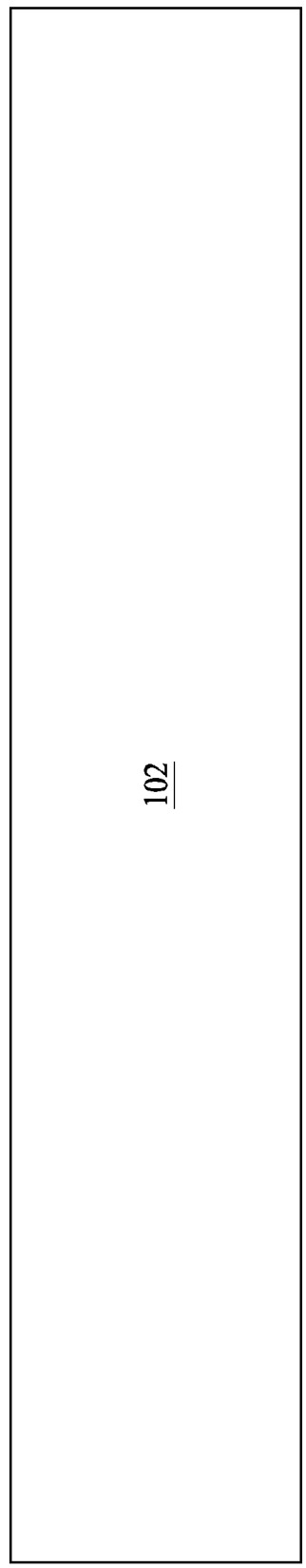
FIGS. 1-7 are cross sections of a pellicle fabricated at various stages, in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present disclosure is directed to a film stack of pellicle, or a pellicle described herein, and method for manufacturing the same. The pellicle film mentioned in the disclosure is formed from a multi-layer stack for providing a barrier to particle contamination, and a peripheral portion of the pellicle film is attached to a pellicle frame while in use. In some embodiments, the pellicle film is in a rectangular shape and has a rectangular external shape, having a rectangular opening at its center. The pellicle film has dimensions which are selected for use with a particular application. For example, the pellicle film may be designed to protect a reticle having a patterned area which is approximately 110 mm by 145 mm. Such a pellicle film would have a pellicle frame which was larger than the reticle, having an opening at a center portion which was at least as big as the reticle.

The concept of the present disclosure is to provide a pellicle film comprised of a graphene layer. The graphene layer has a better mechanical and thermal performance compared to existing materials used for fabrication of pellicle films. In particular, the graphene layer has the advantage of being superior in characteristic such as the Young's modulus, ultimate strength, thermal conductivity and emissivity level.

One or both of the sides of the graphene layer may be capped with a capping layer, for example, a metal layer, a silicon carbide (SiC) layer or a diamond layer may be suitable for use. The capping layers referred to above may help to reduce the effect of hydrogen radicals (or other reactive species) which may be generated from hydrogen gas in the presence of extreme ultraviolet (EUV) radiation, and which may cause damage to the pellicle film. The pellicle film may include a capping layer on top or in a sandwich kind.

Details regarding the pellicle films and methods of forming the same are described in following by embodiments. Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person of ordinary skill in the art.

Embodiment 1

FIGS. 1-7 are cross sections of a pellicle film fabricated at various stages, in accordance with some embodiments of the present disclosure. In FIG. 1, a supporting substrate 102 is provided. The supporting substrate 102 may be a bulk silicon substrate. Alternatively, the supporting substrate 102 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible supporting substrates 102 also include a silicon-on-insulator (SOI) substrate. SOI substrates are fabricated using separation by implantation of oxygen (SIMOX), wafer bonding, and/or other suitable methods.

Some exemplary supporting substrates 102 include an insulator layer. The insulator layer is comprised of any suitable material, including oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET, the insulator layer is a component (e.g., layer) of a silicon-on-insulator substrate.

Figure 2:
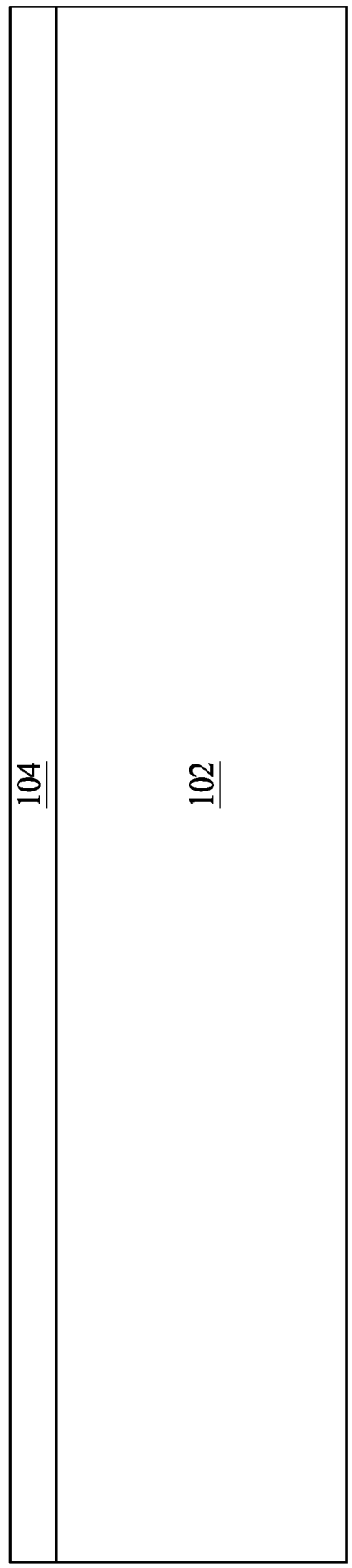

In FIG. 2, an oxide layer 104 is formed on the supporting substrate 102. The oxide layer 104 employed here allows for formation of a subsequent metal layer over the supporting substrates 102. In addition, a high etching selectivity between the oxide layer 104 and the subsequently-deposited metal layer is also advantageous to the etching operation used to etch away most of the supporting substrate 102 and the oxide layer 104.

According to an embodiment of the present disclosure, the oxide layer 104 is formed by a chemical vapor deposition (CVD) method. However, there are no particular restrictions on a method for forming the oxide layer 104, and the oxide layer 104 can be formed using other heretofore known methods. Moreover, the thickness of the oxide layer 104 is not limited.

Figure 3:
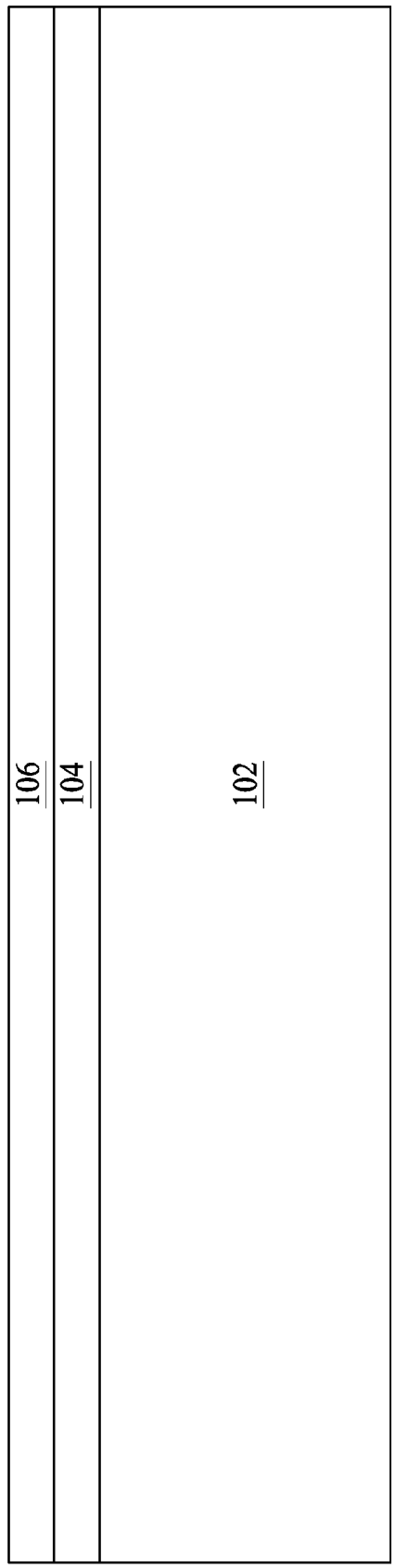

After forming the oxide layer 104, a metal layer 106 is blanket deposited on the oxide layer 104 using an atomic layer deposition (ALD) method as shown in FIG. 3. However, this is not a limitation of the present disclosure, in some embodiments, the metal layer 106 may be formed on the oxide layer 104 using any other methods. According to an embodiment of the present disclosure, ruthenium (Ru) is employed for being a graphene catalyst, i.e., a catalyst that aids in the growth of graphene over the oxide layer 104 in subsequent operations. In other embodiments other elements or materials, including alloys, can be substituted for the ruthenium catalyst such as nickel (Ni), palladium (Pd), iridium (Ir), copper (Cu) and Titanium (Ti). A thickness of the metal layer 106 depends on the material properties. In this embodiment, the Ru layer 106 may be approximately below 5 nm thick.

Figure 4:
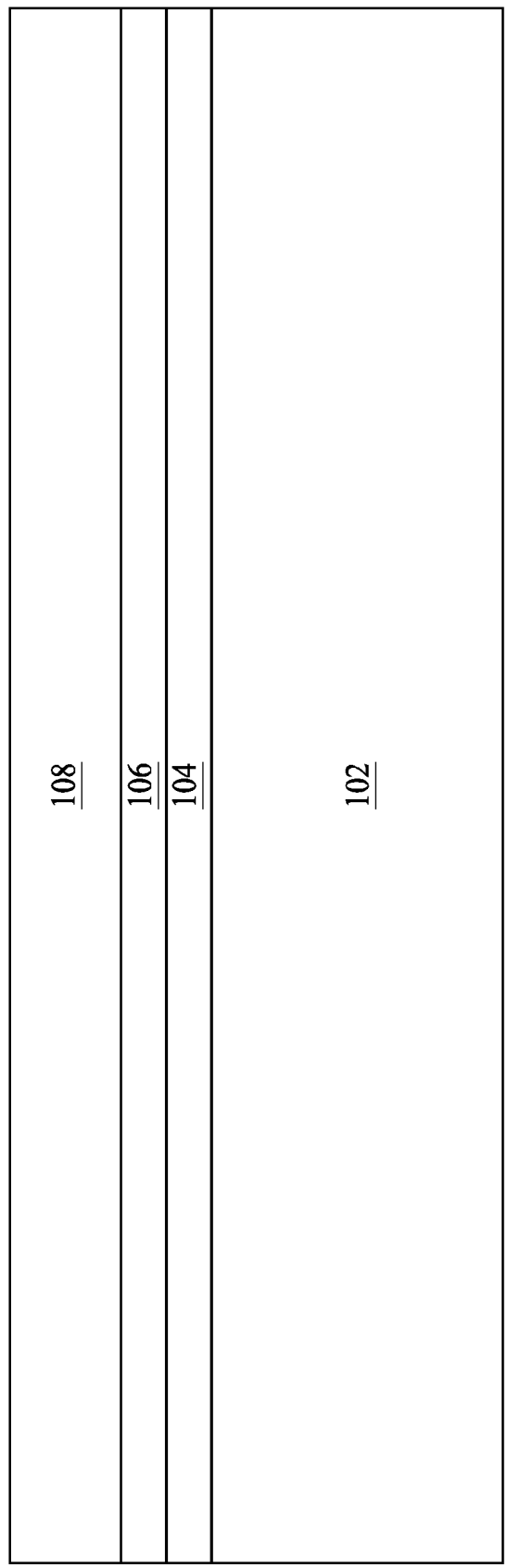

Referring now to FIG. 4, in accordance with an exemplary embodiment, growth of a layer of graphene, herein referred to as a graphene layer 108, is illustrated. In this embodiment, the graphene layer 108 is grown, using a plasma enhanced chemical vapor deposition (PECVD) method, from both solid and liquid carbon sources, and at a temperature between about 300 Celsius degree to about 1100 Celsius degree. The graphene layer 108 is formed over the oxide layer 104. In yet other embodiments, the temperature at which the graphene layer 108 is grown, using different catalysts than those referenced in this disclosure, can be above and/or below the range of about 300 Celsius degree to about 1100 Celsius degree. In this embodiment, the graphene layer 108 may be in a range of about 10 nm thick to about 20 nm thick. However, this is not a limitation of the present disclosure.

Such a graphene layer 108 as described above has the role of, for example, improving mechanical and thermal properties for the entire film stack of the pellicle. The mechanical properties of the pellicle film are quite crucial because the pellicle film must be made of an extremely thin film in order to allow for sufficient transparency to EUV radiation so as to not reduce the performance of the lithographic operation. The advantageous mechanical properties of the graphene layer 108 includes the Young's modulus of about 2400 GPa which is higher than the Young's modulus, about 185 GPa, of a silicon layer, and the Young's modulus, about 310 GPa, of a silicon nitride ($Si_3N_4$) layer, wherein the silicon and/or silicon nitride layer are commonly adopted by existing pellicle film fabrication. Another advantageous mechanical property of the graphene layer 108 is the Ultimate strength of about 130000 MPa which is also much higher than the Ultimate strength, about 7000 MPa, of the monocrystalline silicon layer, and the Ultimate strength, about 360-434 MPa, of a silicon nitride ($Si_3N_4$) layer.

The heat dissipation ability, i.e. the thermal property, of the pellicle film is also pivotal since the EUV light radiation from a high-output EUV light source can dramatically increase a temperature of the pellicle film to about 900 Celsius degree. The advantageous thermal properties of the graphene layer 108 includes the thermal conductivity of about 1000 W/mK up which is higher than the thermal conductivity, about 150 W/mK, of a silicon layer, and the thermal conductivity, about 30 W/mK, of a silicon nitride ($Si_3N_4$) layer. Another advantageous mechanical property of the graphene layer 108 is the emissivity level of about 0.99 which is also much higher than the emissivity level, about 0.4, of the silicon layer, and the emissivity level, about 0.89-0.97, of a silicon nitride ($Si_3N_4$) layer.

Figure 5:
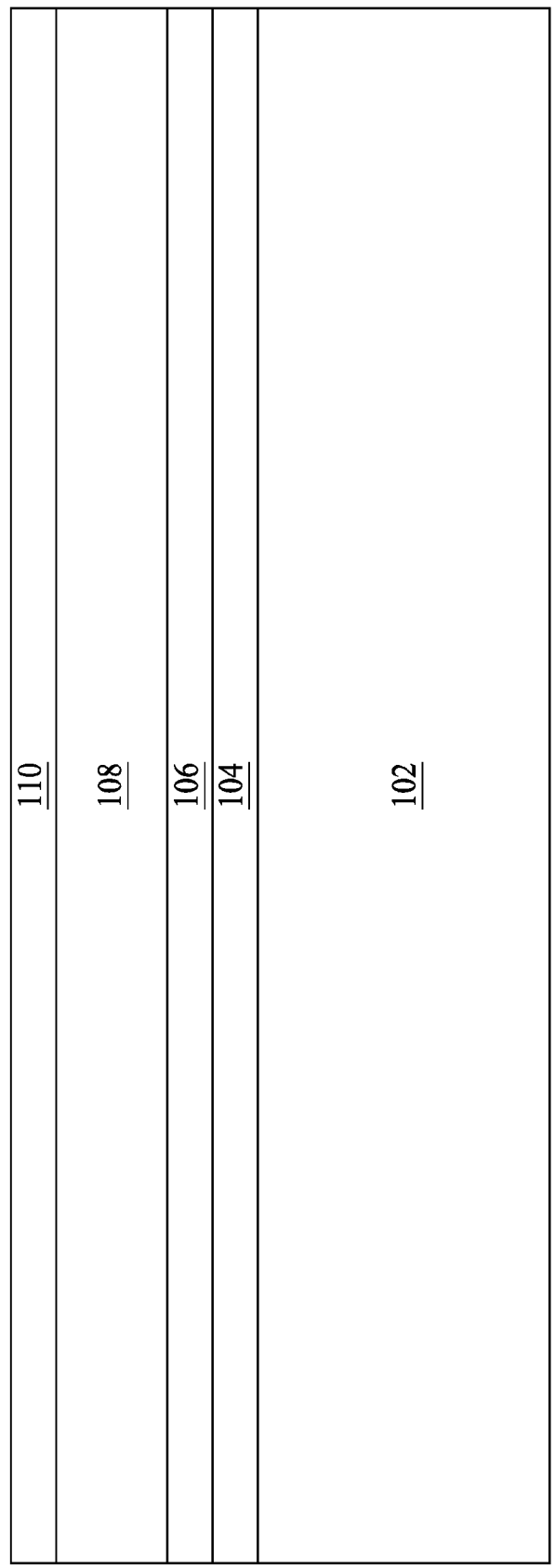

Referring now to FIG. 5, in accordance with an exemplary embodiment, blanket formation of a layer of silicon carbide, herein referred to as a silicon carbide layer 110, is illustrated. In this embodiment, the silicon carbide layer 110 is grown, using a chemical vapor deposition (CVD) method, over a top side of the graphene layer 108 as a capping layer. In this way, the silicon carbide layer 110, the graphene layer 108 and the metal layer 106 jointly form a sandwiched structure, i.e. a film stack of the pellicle. In this embodiment, the silicon carbide layer 110 may be in a range of about 5 nm thick to about 10 nm thick. However, this is not a limitation of the present disclosure.

The silicon carbide layer 110 can provide protection to the graphene layer 108 to reduce the adverse effect of hydrogen radicals (or other reactive species) which may be generated from hydrogen gas in the presence of EUV radiation, and which may cause damage to the graphene layer 108. In some embodiments, a metal layer may be suitable for replacing the silicon carbide layer 110 as well. Suitable material of the metal layer may be similar to those used in the metal layer 106, including Ru, Ni, Pd, Ir, Cu and Ti. In some other embodiments, a diamond layer may be suitable for use as well.

Figure 6:
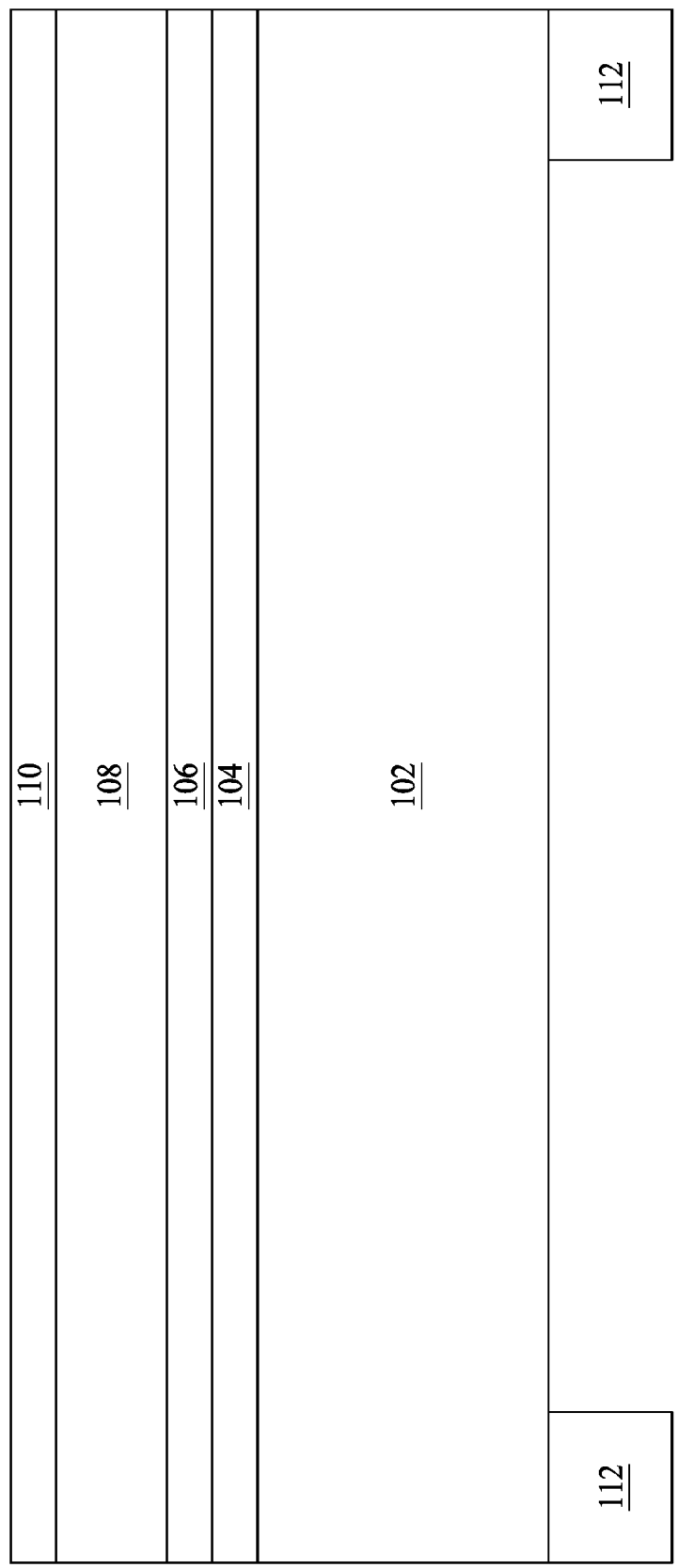

Referring now to FIG. 6, in accordance with an exemplary embodiment, formation of a hard mask, herein referred to as a hard mask 112, is illustrated. In this embodiment, at least one silicon nitride layer is deposited on the support substrate 102 as a hard mask layer using low-pressure chemical vapor deposition (LPCVD). LPCVD is a chemical process used to produce high purity thin films. The support substrate 102 is exposed to one or more volatile precursor chemical compounds which react and/or decompose on the substrate surface to produce the desired film. In LPCVD, this process is performed at sub-atmospheric pressures to reduce unwanted gas phase interactions and improve the uniformity of the film across the support substrate 102. Mask materials and processes are not limited to examples described herein but may include a variety of suitable materials and processes that withstand wet or dry etch processes. By way of example and not limitation, these materials and processes may include deposition of dense oxide, low stress silicon nitride, metallic layers, and polymeric layers.

Thereafter, a photoresist (not illustrated in FIG. 6) is applied to a bottom surface of the hard mask layer. The photoresist is a light sensitive material used to form a patterned coating on the surface. According to an embodiment, a negative photoresist is used. Portions of the negative photoresist are exposed to ultraviolet light. The ultraviolet light cures the portions of the photoresist it strikes. The cured areas of the photoresist layer become relatively insoluble to a photoresist developer. The photoresist developer then dissolves the uncured portions of the photoresist layer, leaving a pattern (or mask) of cured photoresist on the bottom surface of the hard mask layer and forms the hard mask 112. In an alternative embodiment, the hard mask layer may be patterned without the use of photoresist.

Figure 7:
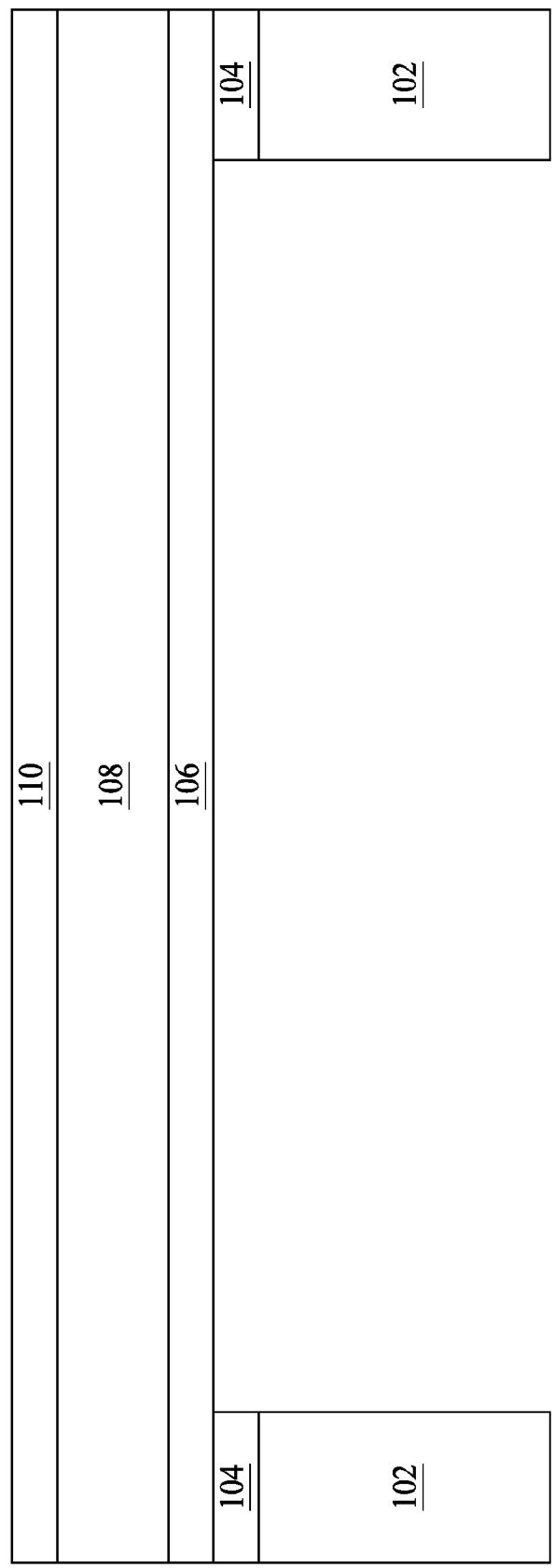

Referring now to FIG. 7, in accordance with an exemplary embodiment, etching of the supporting substrate 102 and the oxide layer 104 is illustrated. In this embodiment, the supporting substrate 102 and the oxide layer 104 are wet and/or dry etched to expose a portion of the metal layer 106 through a window in the hard mask 112. A high etching selectivity between the oxide layer 104 and the subsequent metal layer is advantageous to the etching operation here to etch away most of the supporting substrate 102 and the oxide layer 104 as mentioned above. In this embodiment, the hard mask 112 is removed with laser micromachining or similar processes. However, this is not a limitation of the present disclosure.

As described heretofore, the present disclosure provides a sandwiched pellicle film superior in mechanical and thermal properties. The entire manufacturing operation is simpler compared to existing method, so that short processing time and high throughput can be achieved. Moreover, the high material etching selectivity during the etching operation helps to reduce the pellicle manufacturing failure rate.

Embodiment 2

Figure 8:
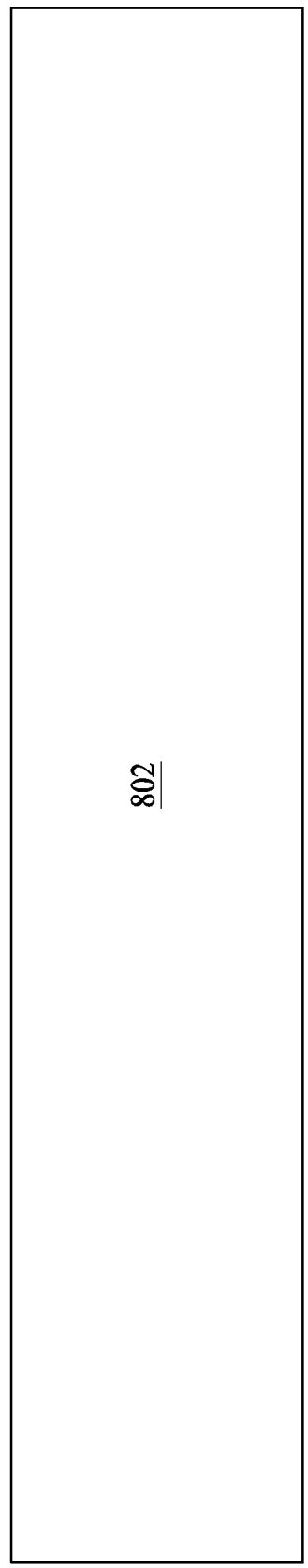
FIGS. 8-13 are cross sections of a pellicle fabricated at various stages, in accordance with some other embodiments of the present disclosure.

FIGS. 8-13 are cross sections of a pellicle film fabricated at various stages, in accordance with some other embodiments of the present disclosure. In FIG. 8, a supporting substrate 802 is provided. Similar to the supporting substrate 102, the supporting substrate 802 may be a bulk silicon substrate. Alternatively, the supporting substrate 802 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible supporting substrates 802 also include a silicon-on-insulator (SOI) substrate. SOI substrates are fabricated using separation by implantation of oxygen (SIMOX), wafer bonding, and/or other suitable methods.

Some exemplary supporting substrates 802 include an insulator layer. The insulator layer is comprised of any suitable material, including oxide, sapphire, other suitable insulating materials, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET, the insulator layer is a component (e.g., layer) of a silicon-on-insulator substrate.

Figure 9:
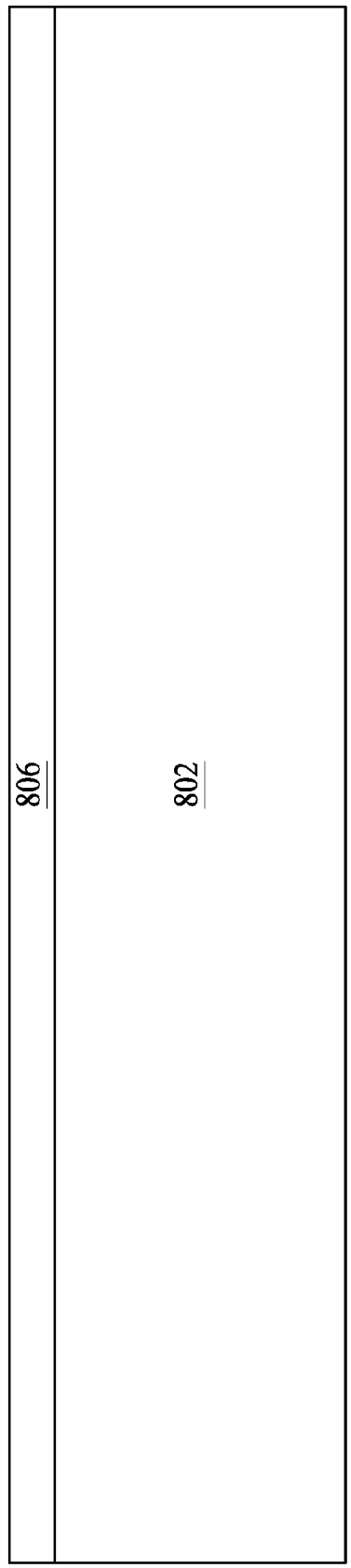

In FIG. 9, a silicon carbide layer 806 is blanket deposited on the supporting substrate layer 802. Not like the embodiment 1 requiring the oxide layer 104 in order to facilitate the formation of a metal layer thereon, in this embodiment, the silicon carbide layer 806 can be formed on the supporting substrate layer 802 directly. In this embodiment, the silicon carbide layer 806 may be in a range of about 5 nm thick to about 10 nm thick. However, this is not a limitation of the present disclosure.

Figure 10:
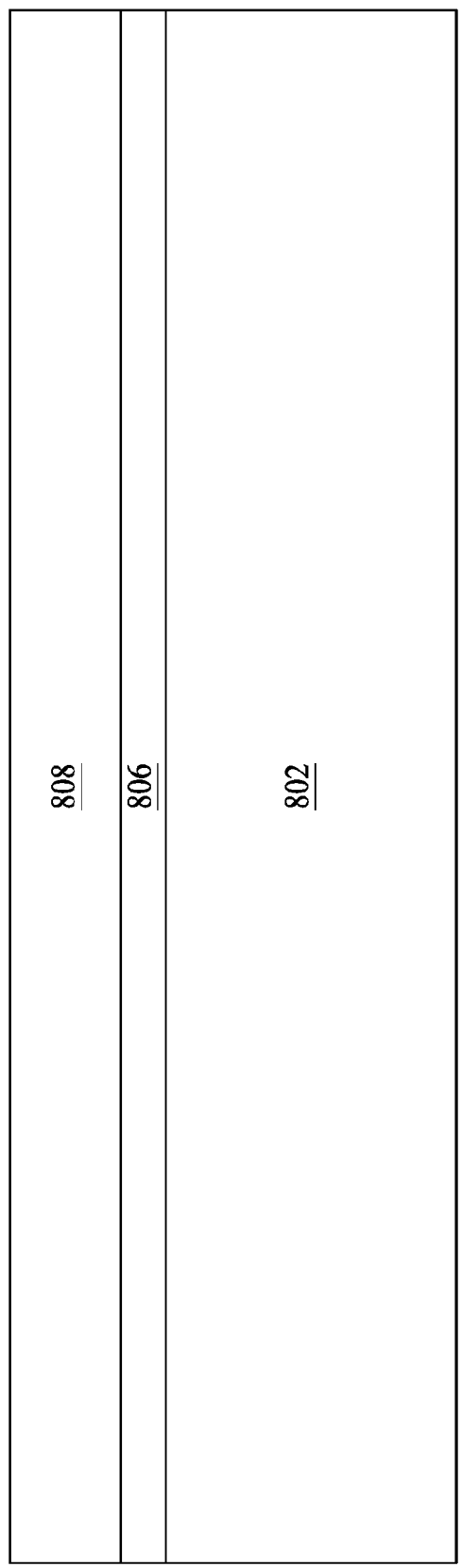

Referring now to FIG. 10, in accordance with an exemplary embodiment, growth of a layer of graphene, herein referred to as a graphene layer 808, is illustrated. In this embodiment, the graphene layer 808 is grown, using a plasma enhanced chemical vapor deposition (PECVD) method, from both solid and liquid carbon sources, and at a temperature between about 300 Celsius degree to about 1100 Celsius degree. The graphene layer 808 is formed over the silicon carbide layer 806. In yet other embodiments, the temperature at which the graphene layer 808 is grown, using different catalysts than those referenced in this disclosure, can be above and/or below the range of about 300 Celsius degree to about 1100 Celsius degree. In this embodiment, the graphene layer 808 may be in a range of about 10 nm thick to about 20 nm thick. However, this is not a limitation of the present disclosure.

As mentioned above, such a graphene layer 808 as described above has the role of, for example, improving mechanical and thermal properties for the entire sandwich pellicle film. The mechanical properties of the pellicle film are quite crucial because the pellicle film must be made of an extremely thin film in order to allow for sufficient transparency to EUV radiation so as to not reduce the performance of the lithographic operation. The advantageous mechanical properties of the graphene layer 808 includes the Young's modulus of about 2400 GPa which is higher than the Young's modulus, about 185 GPa, of a silicon layer, and the Young's modulus, about 310 GPa, of a silicon nitride ($Si_3N_4$) layer, wherein the silicon and/or silicon nitride layer are commonly adopted by existing pellicle film fabrication. Another advantageous mechanical property of the graphene layer 808 is the Ultimate strength of about 130000 MPa which is also much higher than the Ultimate strength, about 7000 MPa, of the monocrystalline silicon layer, and the Ultimate strength, about 360-434 MPa, of a silicon nitride ($Si_3N_4$) layer.

The heat dissipation ability, i.e. the thermal property, of the pellicle film is also pivotal since the EUV light radiation from a high-output EUV light source can dramatically increase a temperature of the pellicle film to about 900 Celsius degree. The advantageous thermal properties of the graphene layer 808 includes the thermal conductivity of about 1000 W/mK up which is higher than the thermal conductivity, about 150 W/mK, of a silicon layer, and the thermal conductivity, about 30 W/mK, of a silicon nitride ($Si_3N_4$) layer. Another advantageous mechanical property of the graphene layer 808 is the emissivity level of about 0.99 which is also much higher than the emissivity level, about 0.4, of the silicon layer, and the emissivity level, about 0.89-0.97, of a silicon nitride ($Si_3N_4$) layer.

Figure 11:
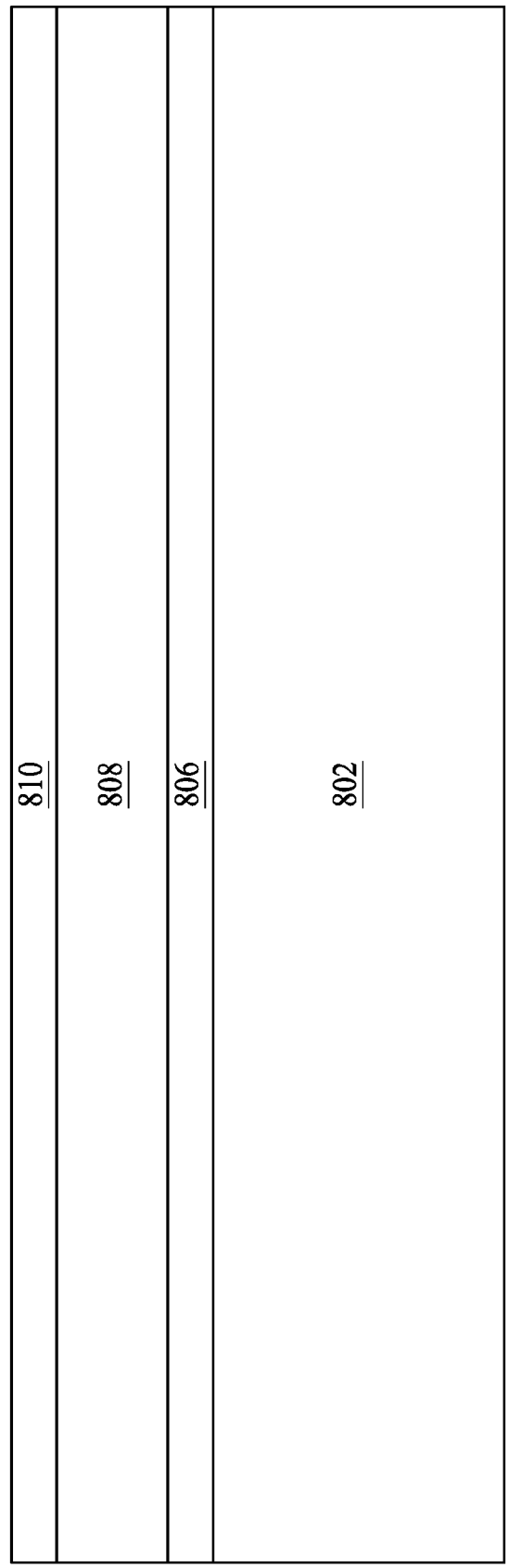

Referring now to FIG. 11, in accordance with an exemplary embodiment, blanket formation of a layer of metal, herein referred to as a metal layer 810, is illustrated. In this embodiment, the metal layer 810 is grown, using an ALD method, over a top side of the graphene layer 808 as a capping layer. However, this is not a limitation of the present disclosure, in some embodiments, the metal layer 810 may be formed on the graphene layer 808 using any other methods. In this way, the metal layer 810, the graphene layer 808 and the silicon carbide layer 806 jointly form a sandwiched structure, i.e. the film stack of the pellicle. In this embodiment, the metal layer 810 may be in a range of about 5 nm thick to about 10 nm thick. However, this is not a limitation of the present disclosure.

The metal layer 810 can provide a protection to the graphene layer 808 to reduce the adverse effect of hydrogen radicals (or other reactive species) which may be generated from hydrogen gas in the presence of EUV radiation, and which may cause damage to the graphene layer 808. Suitable material of the metal layer may be similar to those used in the metal layer 106, including Ru, Ni, Pd, Ir, Cu, Ti and the like. In some other embodiments, a silicon carbide layer may be suitable for use as well. In yet some other embodiments, a diamond layer may be suitable for use as well.

Figure 12:
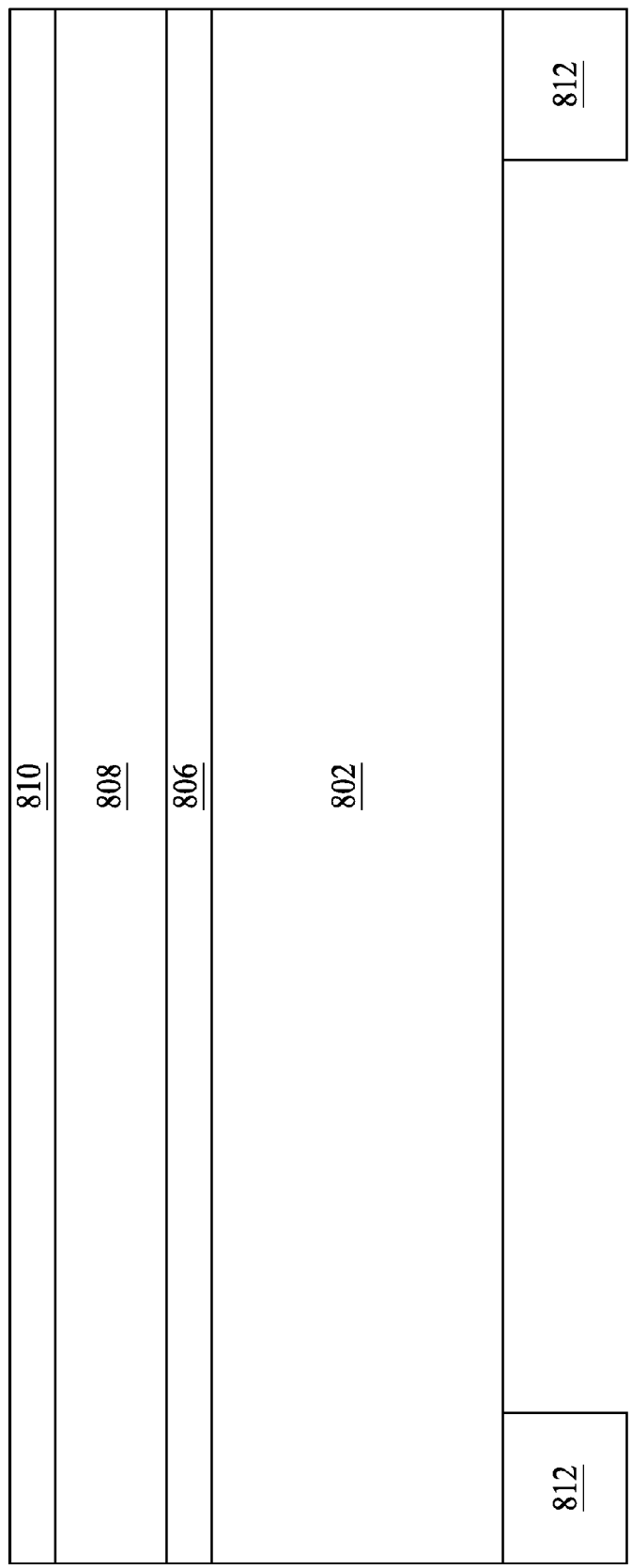

Referring now to FIG. 12, in accordance with an exemplary embodiment, formation of a hard mask, herein referred to as a hard mask 812, is illustrated. In this embodiment, at least one a silicon nitride layer as a hard mask layer is deposited on the support substrate 802 using low-pressure chemical vapor deposition (LPCVD). LPCVD is a chemical process used to produce high purity thin films. The support substrate 802 is exposed to one or more volatile precursor chemical compounds which react and/or decompose on the substrate surface to produce the desired film. In LPCVD, this process is performed at sub-atmospheric pressures to reduce unwanted gas phase interactions and improve the uniformity of the film across the support substrate 802. Mask materials and processes are not limited to examples described herein but may include a variety of suitable materials and processes that withstand wet or dry etch processes. By way of example and not limitation, these materials and processes may include deposition of dense oxide, low stress silicon nitride, metallic layers, and polymeric layers.

Thereafter, a photoresist (not illustrated in FIG. 12) is applied to a bottom surface of the hard mask layer. The photoresist is a light sensitive material used to form a patterned coating on the surface. According to an embodiment, a negative photoresist is used. Portions of the negative photoresist are exposed to ultraviolet light. The ultraviolet light cures the portions of the photoresist it strikes. The cured areas of the photoresist layer become relatively insoluble to a photoresist developer. The photoresist developer then dissolves the uncured portions of the photoresist layer, leaving a pattern (or mask) of cured photoresist on the bottom surface of the hard mask layer and forms the hard mask 812. In an alternative embodiment, the hard mask layer may be patterned without the use of photoresist.

Figure 13:
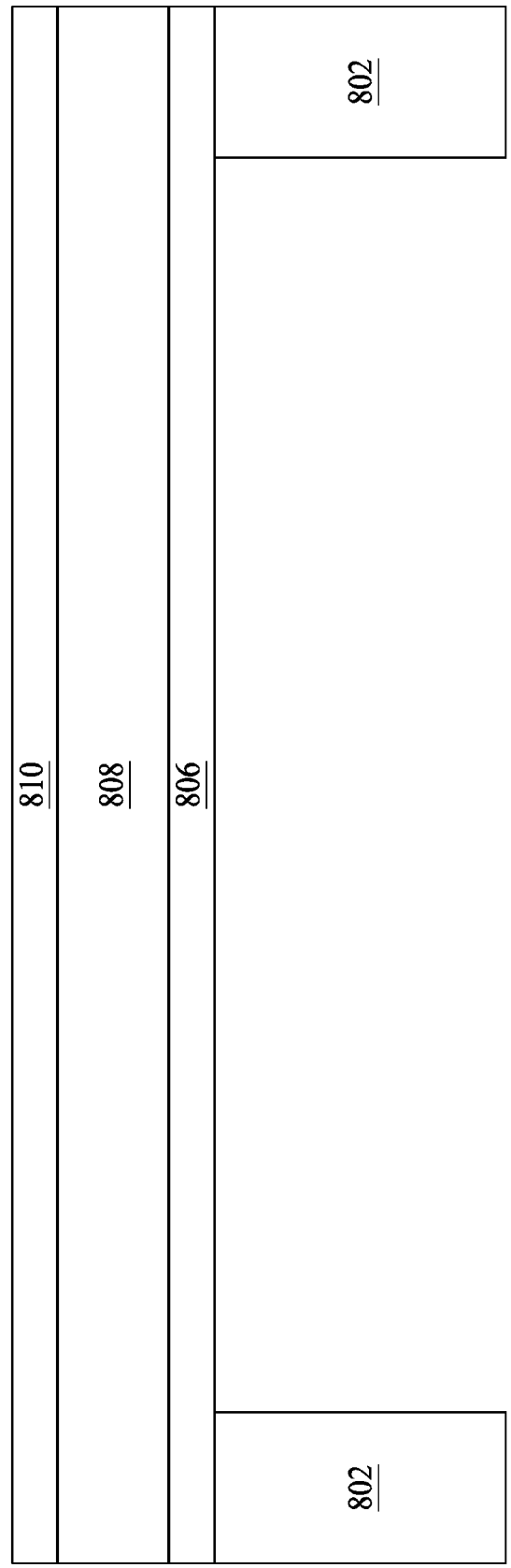

Referring now to FIG. 13, in accordance with an exemplary embodiment, etching of the supporting substrate 802 is illustrated. In this embodiment, the supporting substrate 802 is wet and/or dry etched to expose a portion of the silicon carbide layer 806 through a window in the hard mask 812. A high etching selectivity between the supporting substrate 802 and the subsequent silicon carbide layer 806 is advantageous to the etching operation here to etch away most of the supporting substrate 802 as mentioned above. In this embodiment, the hard mask 812 is removed with laser micromachining or similar processes. However, this is not a limitation of the present disclosure.

As described heretofore, the present disclosure provides a sandwich pellicle film superior in mechanical and thermal properties. The entire manufacturing operation is simpler compared to existing method, so that short processing time and high throughput can be achieved. Moreover, the high material etching selectivity during the etching operation helps to reduce the pellicle manufacturing failure rate.

Some embodiments of the present disclosure provide a method for manufacturing a pellicle, including: providing a supporting substrate; forming an oxide layer over the supporting substrate; forming a metal layer over the oxide layer; forming a graphene layer over the metal layer; and removing at least a portion of the supporting substrate and the oxide layer.

Some embodiments of the present disclosure provide a method for manufacturing a pellicle, including: providing a supporting substrate; forming a first silicon carbide (SiC) layer or a diamond layer over the supporting substrate; forming a graphene layer over the first SiC layer or the diamond layer; and removing at least a portion of the supporting substrate and the first silicon carbide (SiC) layer or the diamond layer; wherein the pellicle is at least partially transparent to extreme ultraviolet (EUV).

Some embodiments of the present disclosure provide a pellicle, including: a graphene layer; a first layer formed on a first side of the graphene layer; and a second layer formed on a second side of the graphene layer; wherein the second side is opposite the first side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a pellicle, comprising:
providing a supporting substrate;
forming an oxide layer over the supporting substrate;
forming a metal layer over the oxide layer;
forming a graphene layer over the metal layer; and
removing at least a portion of the supporting substrate and the oxide layer.

2. The method of claim 1, further comprising:
forming a silicon carbide (SiC) layer over the graphene layer.

3. The method of claim 2, wherein the step of forming the SiC layer over the graphene layer comprises:
chemical vapor depositing (CVD) the SiC layer over the graphene layer.

4. The method of claim 1, further comprising:
forming a diamond layer over the graphene layer.

5. The method of claim 4, wherein the step of forming the diamond layer over the graphene layer comprises:
chemical vapor depositing (CVD) the diamond layer over the graphene layer.

6. The method of claim 1, wherein the step of removing at least the portion of the supporting substrate and the oxide layer comprises:
wet etching the supporting substrate and the oxide layer.

7. The method of claim 1, wherein the step of removing at least the portion of the supporting substrate and the oxide layer comprises:
removing a center portion of the supporting substrate and the oxide layer, whereby the center portion remained being at least partially transparent to extreme ultra violet (EUV).

8. The method of claim 7, further comprising:
attaching a pellicle frame to a peripheral portion of the supporting substrate.

9. The method of claim 1, wherein the step of forming the metal layer over the oxide layer comprises:
atomic layer depositing (ALD) the metal layer over the oxide layer.

10. The method of claim 1, wherein the step of forming the graphene layer over the metal layer comprises:
chemical vapor depositing (CVD) the graphene layer over the metal layer.

11. A method for manufacturing a pellicle, comprising:
forming an oxide layer;
forming a metal layer over the oxide layer;
forming a graphene layer over the metal layer; and
removing at least a portion of the oxide layer to expose the metal layer.

12. The method of claim 11, further comprising:
forming a SiC layer over the graphene layer.

13. The method of claim 11, wherein the step of removing at least the portion of the oxide layer comprises:
wet etching the oxide layer.

14. The method of claim 11, wherein the step of removing at least the portion of the oxide layer comprises:
removing a center portion of the oxide layer while keeping a peripheral portion of the oxide layer intact, whereby the center portion remained is transparent to the EUV.

15. The method of claim 14, further comprising:
attaching a pellicle frame over the peripheral portion of the oxide layer.

16. A pellicle, comprising:
a graphene layer;
a first layer formed on a first side of the graphene layer;
a second layer formed on a second side of the graphene layer, wherein the second side is opposite the first side; and
a supporting structure on a peripheral region of the second layer and not covering a central region of the second layer, the supporting structure including:
an oxide layer on the second layer; and
a substrate layer on the oxide layer.

17. The pellicle of claim 16, wherein the pellicle is in rectangular shape.

18. The pellicle of claim 16, wherein the first layer or the second layer includes a metal layer.

19. The pellicle of claim 16, wherein the first layer or the second layer includes a silicon carbide (SiC) layer.

20. The pellicle of claim 16, wherein the first layer or the second layer includes a diamond layer.

* * * * *